(12) United States Patent
Willis

(10) Patent No.: US 6,243,274 B1
(45) Date of Patent: Jun. 5, 2001

(54) SHIELDS FOR ELECTRONIC COMPONENTS WITH READY ACCESS TO SHIELDED COMPONENTS

(75) Inventor: John A. Willis, Rochester, NY (US)

(73) Assignee: Redcom Laboratories, Inc., Victor, NY (US)

( * ) Notice: Subject to any disclaimer, the term of this patent is extended or adjusted under 35 U.S.C. 154(b) by 0 days.

(21) Appl. No.: 09/553,212

(22) Filed: Apr. 20, 2000

(51) Int. Cl.[7] ...................................................... H05K 9/00
(52) U.S. Cl. .......................... 361/816; 361/818; 361/824; 361/807; 361/808; 361/809; 361/810; 174/35 R; 174/35 MS
(58) Field of Search ........................... 361/730, 735–737, 361/742, 748, 752, 753, 758, 800, 807–810, 816, 818, 824–825; 174/35 R, 35 MS

(56) References Cited

U.S. PATENT DOCUMENTS

| | | | |
|---|---|---|---|
| 4,357,062 | * 11/1982 | Everrett | 339/18 R |
| 4,717,990 | * 1/1988 | Tugcu | 361/818 |
| 4,977,483 | * 12/1990 | Perretta | 361/816 |
| 5,596,487 | * 1/1997 | Castaneda et al. | 361/814 |
| 5,633,786 | * 5/1997 | Matuszewski et al. | 361/818 |
| 5,812,374 | * 9/1998 | Shuff | 361/704 |
| 5,847,317 | * 12/1998 | Phelps | 174/35 R |
| 5,917,165 | * 6/1999 | Platt et al. | 200/600 |
| 6,058,024 | * 5/2000 | Lyford | 361/816 |

FOREIGN PATENT DOCUMENTS

| | | | |
|---|---|---|---|
| 62-187056 | * 7/1987 | (JP) | 361/816 |
| 03311589 | * 10/1991 | (JP) | 361/816 |

* cited by examiner

Primary Examiner—Jeffrey Gaffin
Assistant Examiner—Tuan Dinh
(74) Attorney, Agent, or Firm—Harris Beach LLP

(57) ABSTRACT

A plurality of shields is provided for shielding selected electronic components and electronic sub-assemblies mounted on a printed wiring board assembly from electromagnetic interference (EMI) and/or from radio frequency interference (RFI). The shields include open-ended electrically conductive casings having lower ends fixedly attached on the printed wiring board so as to surround selected components. A compliant electrically conductive member is positioned in common over upper ends of the casings. An electrically conductive housing disposed over the compliant member provides compression of the compliant member such that electrical contact is maintained between the housing on the upper ends of the casings. A grounded base plate is spaced from the wiring board assembly. The housing is removably attached to the base plate to provide the plurality of shields. Access to the components and sub-assemblies is obtained by removal of the housing from the base plate and by removal of the compliant member from the upper ends of the casings.

9 Claims, 4 Drawing Sheets

SHIELDS FOR ELECTRONIC COMPONENTS WITH READY ACCESS TO SHIELDED COMPONENTS

BACKGROUND OF INVENTION

1. Field of the Invention

The present invention relates generally to shields for shielding selected electronic components and electronic sub-assemblies mounted on a printed wiring board assembly from electromagnetic interference (EMI) and/or from radio frequency interference (RFI). More particularly, the present invention relates to shields which provide ready access to shielded components for servicing.

2. Description of the Invention Background

Conventional EMI/RFI shielding systems use a number of individual electrically conductive shields constructed as containers which have sidewalls merging with an integral upper surface. An open-ended lower surface of each container is positioned on a printed wiring board assembly to enclose an electronic component or sub-assembly which is to be shielded. The open-ended surface is fixedly attached to the wiring board assembly, usually by soldering. Each individual container is connected to ground potential either by connection to a ground bus designed to intercept the solder area covered by the open-ended container surface, or by providing a common ground connection to all shields subsequent to soldering the open-ended container surfaces to the wiring board assembly. Frequently, the entire wiring board assembly is protected by an outer shield or housing against environmental influences such as, for example, dust, moisture, or intense light.

When access is required to electronic components shielded by such conventional container-shaped shields, for example, for testing or servicing purposes, individual shields must be removed by breaking the soldered connection between the open-ended surfaces and the wiring board. This procedure is time-consuming and frequently results in damage to the wiring board. Efficient troubleshooting is hindered since a technician will feel compelled to make an "educated guess" as to which shield to remove first and damage to the wiring board may be severe so as to preclude re-use of the wiring board. Thus, while "integral-container shields" provide desired EMI/RFI shielding of electronic components mounted on a printed wiring board, such prior art shields pose significant disadvantages when access to shielded components or sub-assemblies is required.

SUMMARY OF THE INVENTION

It is an object of the present invention to provide a plurality of EMI/RFI shields for shielding selected electronic components disposed on a printed wiring board wherein all shielded components are readily accessible for servicing without damage to the printed wiring board.

It is another object of the present invention to provide a plurality of EMI/RFI shields for shielding selected electronic components disposed on a printed wiring board wherein the plurality of shields have a common height dimension.

It is a further object of the present invention to provide a plurality of EMI/RFI shields for shielding selected electronic components disposed on a printed wiring board wherein the plurality of shields are formed of open-ended conductive casings having sidewalls of a common height dimension.

It is a still further object of the present invention to provide a plurality of EMI/RFI shields for shielding selected electronic components disposed on a printed wiring board wherein a compliant conductive member provides a common and removable cover for upper ends of open-ended conductive casings.

The foregoing and other objects and advantages of the present invention are achieved in the construction of a plurality of EMI/RFI shields for shielding each one of a plurality of selected electronic components and of selected electronic sub-assemblies disposed on a printed wiring board assembly. The shields are constructed as open-ended electrically conductive casings which have sidewalls of a common height dimension extending between lower ends and upper ends of the casings. The lower ends of the casings are fixedly attached on the printed wiring board assembly such that each shield surrounds selected electronic components and selected electronic sub-assemblies. A compliant electrically conductive member has lower and upper surfaces. The lower surface of the compliant member is disposed in common over the upper ends of the casings. An electrically conductive housing is positioned over the upper surface of the compliant member. A surface of the housing provides compression of the compliant member such that electrical contact is maintained between the housing and the upper ends of the casings. An electrically conductive base plate is spaced from the wiring board assembly. The base plate is connected to an electrical ground potential. The housing is removably attached to the base plate. When the housing is attached to the base plate, the plurality of shields are operative. When the housing is removed from the base plate and the compliant member is removed from the upper ends of the casings, access to the selected electronic components and to the selected electronic sub-assemblies is provided.

DETAILED DESCRIPTION OF THE DRAWINGS

DETAILED DESCRIPTION OF THE EMBODIMENTS

Figure 1:
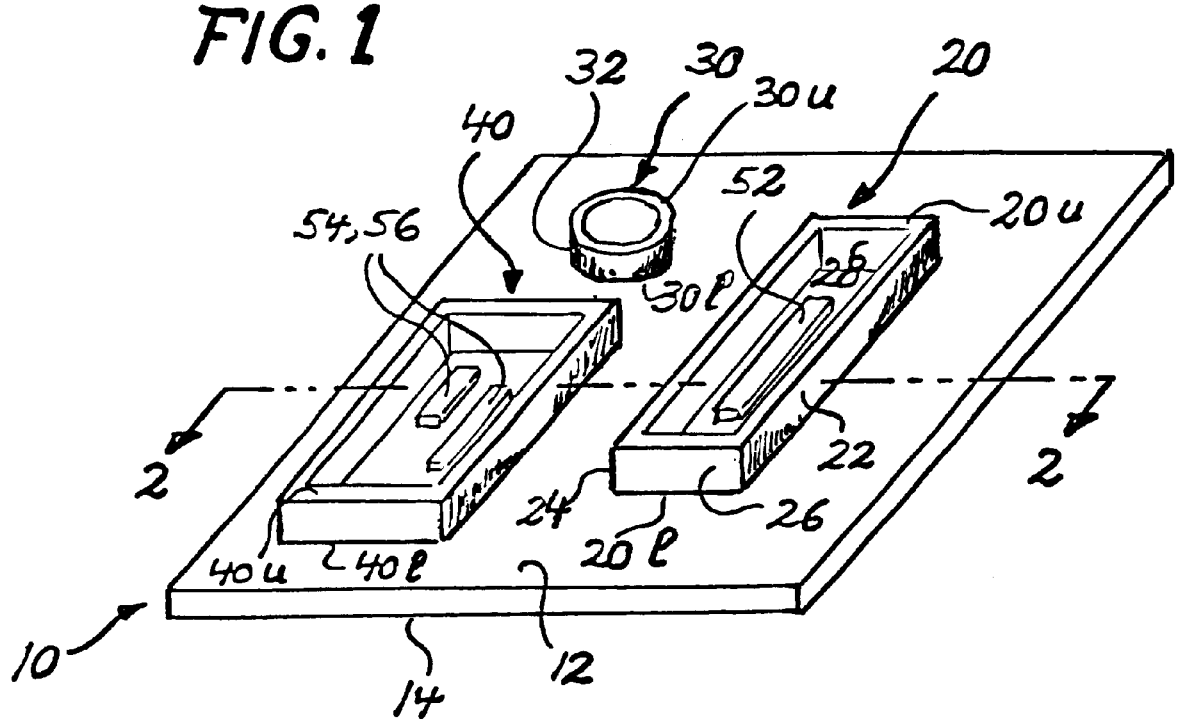
FIG. 1 is a simplified schematic perspective view of printed wiring board assembly in which selected electronic components are surrounded by open-ended electrically conductive casings.

FIG. 1 is a schematic perspective view of a printed wiring board assembly 10 which has an upper wiring board surface 12 and a lower wiring board surface 14. As is well known in the art, printed wiring board assemblies can have numerous wires and electronic components mounted on both the upper and lower wiring board surfaces 12 and 14. For illustrative purposes only, and to simplify the drawings, only three electronic components or electronic subassemblies 52, 54, and 56 are shown in the drawings mounted on the upper wiring board surface 12.

The electronic component 52 is surrounded by a rectangular casing 20. The casing 20 has an open upper end 20u, and a lower end 20l which are fixedly attached to the upper wiring board surface 12, for example, by soldering or by using an electrically conductive adhesive (not shown). The casing 20 has opposing sidewalls 22 and 24, as well as 26 and 28. Electronic component or sub-assembly 52 was preselected to be shielded from electromagnetic interference (EMI) or from radio frequency interference (RFI). Alternatively, shielding of the electronic component 52 may be required to prevent this component from emitting signals during operation of the printed wiring board assembly 10.

An open-ended cylindrical casing 30 has a sidewall 32 which extends from a lower end 30l to an upper end 30u of the casing. The lower end 30l of the casing is fixedly attached to the upper wiring board surface 12 by soldering or by adhesively bonding with an electrically conductive adhesive.

Finally, an open-ended rectangular casing 40 surrounds the electronic components 54 and 56. The casing 40 has opposing sidewalls (not specifically identified) extending between a lower casing end 40l and an upper casing end 40u. The lower end 40l of the casing 40 is fixedly attached to the upper wiring board surface 12 in a manner described previously.

All casings 20, 30, and 40 are electrically conductive and are preferably fabricated by simple linear metal bending operations from a suitable metal or metal alloy which can be easily bonded to the wiring board surface by any of the techniques commonly employed in the manufacture of printed wiring board assemblies.

Figure 2:
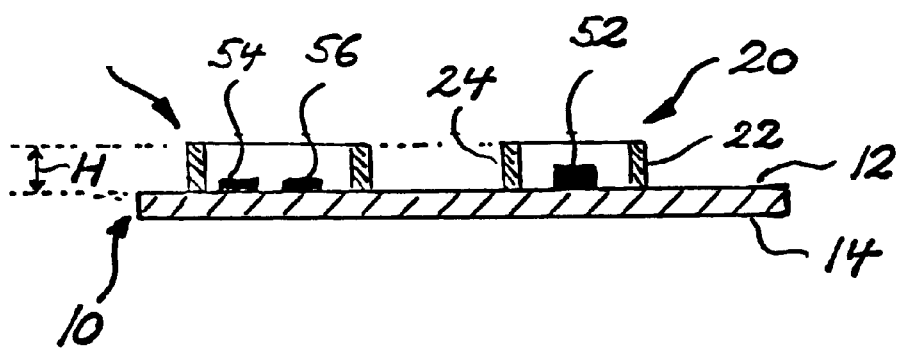
FIG. 2 is a schematic sectional view of the wiring board assembly, taken along the section lines 2—2 of FIG. 1.

FIG. 2 is a schematic sectional view of the printed wiring board assembly, taken along the section lines 2—2, of the assembly of FIG. 1. A height dimension H is a height dimension common to all casings 20, 30, and 40. It will be appreciated that fabricating such casings to the same height dimension H allows the use of a common width of a feedstock material, thereby reducing any loss of material and providing simplified metal fabrication procedures. The common height dimension H of the open-ended casings is selected such that the upper ends of the casings will extend beyond the largest thickness dimension of an electronic component or of an electronic sub-assembly.

Figure 7A:
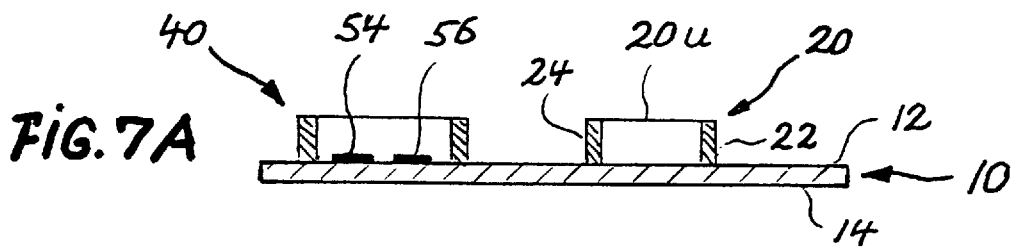
FIG. 7A is a sectional view of a printed wiring board assembly having electronic component one casing, and depicting a second casing without an electronic component.
Figure 7B:
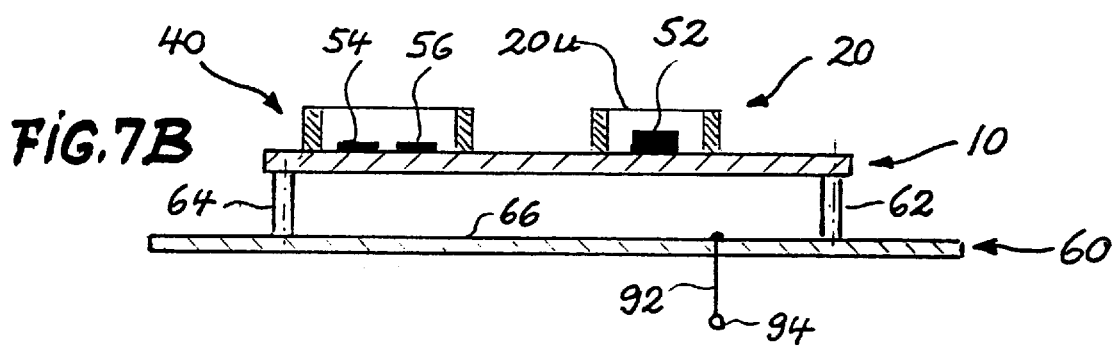
FIG. 7B is a sectional view of the printed wiring board assembly of FIG. 7A, now spaced from a base plate, and having an electronic component inserted in the second casing.

An advantage of the open-ended casings of the present invention is that electronic components to be shielded can be inserted into the printed wiring board after the casings have been attached to the wiring board (see FIGS. 7A, 7B). Such insertion is particularly advantageous for electronic components which are sensitive to environmental conditions such as, for example, temperature and fumes, which may prevail during bonding of the lower ends of the casings to the wiring board assembly. This option of post-bonding component insertion is not available when conventional closed-container shields are used.

Figure 3:
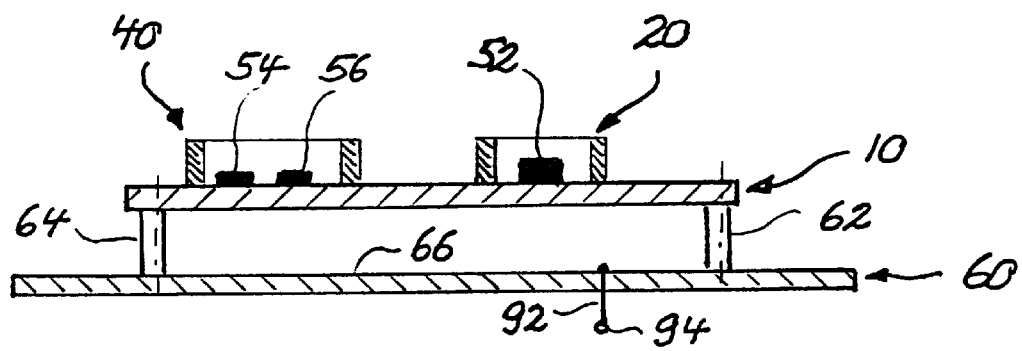
FIG. 3 is sectional view of the wiring board assembly of FIG. 2 shown spaced from an electrically conductive base plate.

Turning to FIG. 3, the printed wiring board 10 is shown spaced from a base plate 60 by spacers 62 and 64. The base plate 60 can be a metallic plate, and alternatively, the base plate can be a plastic plate or a plate of a plastic composite material which has an electrically conductive surface 66. This electrically conductive surface 66 can be in a form of a metallized surface coating or in a form of a metal cladding. A base plate lead 92 is attached to the conductive portion of the base plate, ending in a ground terminal 94.

Figure 4:
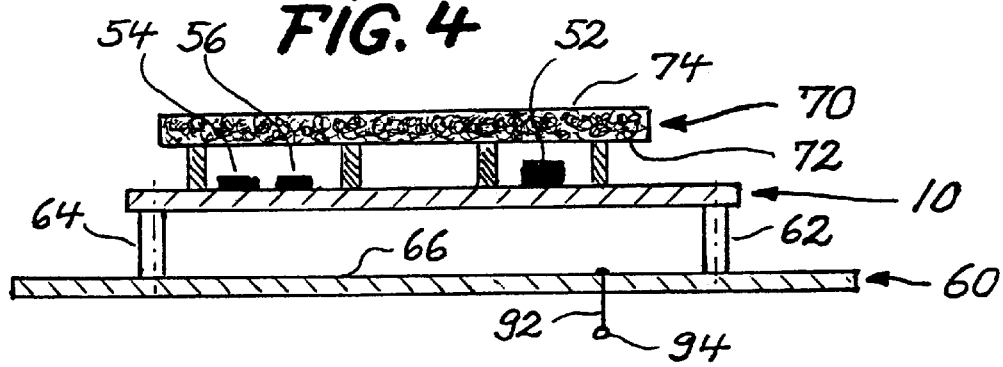
FIG. 4 is a sectional view of the wiring board assembly as depicted in FIG. 3, and showing a compliant electrically conductive member positioned over upper ends of casings.

In FIG. 4, a compliant electrically conductive member 70 is shown disposed over the upper ends of the casings 20, 40 of FIG. 3. The physically compliant electrically conductive member 70 can be an electrically conductive foam, or an electrically conductive elastomer. Alternatively, the member 70 can be formed from a physically compliant material which has an electrically conductive surface such as, for example, a wrap-round conductive fabric. The member 70 has a lower surface 72 touching the upper ends of the casings, and an opposing upper surface 74.

Figure 5:
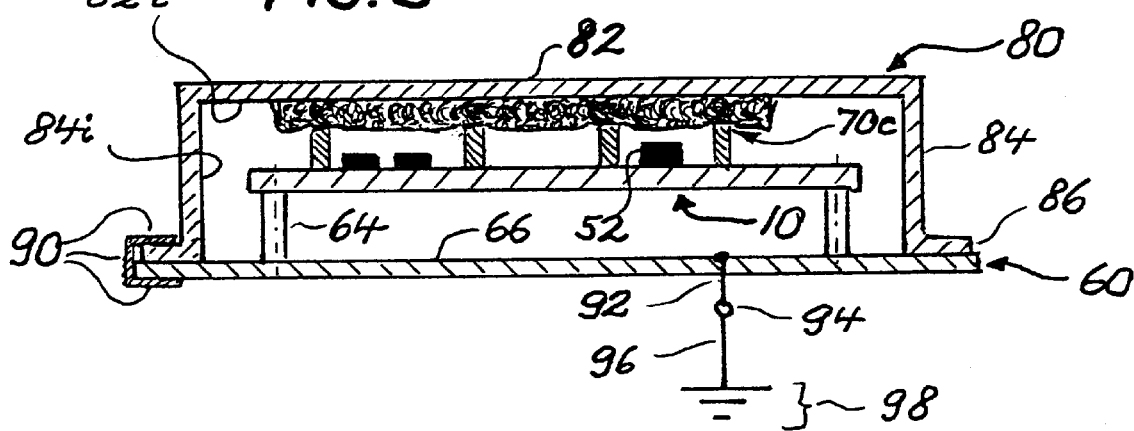
FIG. 5 is a sectional view of a completed wiring board assembly in which an electrically conductive housing is removably attached to, and electrically connected with, the base plate, such that the compliant member is compressed to provide electrical contact between the housing and upper ends of the casings.

FIG. 5 is a sectional view of a completed wiring board assembly in which an electrically conductive housing 80 is removably attached to the base plate 60 by, for example, clamping means 90 positioned along a perimeter flange 86 of the housing 80. The housing 80 has an upper surface 82 and side surfaces 84. The housing 80 can be a metal housing, and alternatively, the housing 80 can be a plastic housing which has an interior electrically conductive upper surface 82i and interior electrically conductive side surfaces 84i which extend to the perimeter flange 86. Such interior electrically conductive surfaces can be achieved by metallizing these surfaces of the housing 80 or by providing a suitable metal cladding to these interior surfaces of the housing. When the housing 80 is attached to the base plate 60, as depicted in FIG. 5, the compliant electrically conductive member 70 is now compressed in regions surrounding the upper ends of the casings, as indicated by the designation 70c. The entire assembly is connected to an electrical ground potential 98 via a ground lead 96 attached to the ground terminal 94.

When testing or servicing of electronic components is required, the housing 80 is removed from the base plate 60, and the compliant member 70 is removed from the upper ends of the casings so that access to shielded electronic components 52, 54, and 56 is readily achieved through the open upper ends of the casings 20 and 40 in the configuration shown in FIG. 3.

Figure 7C:
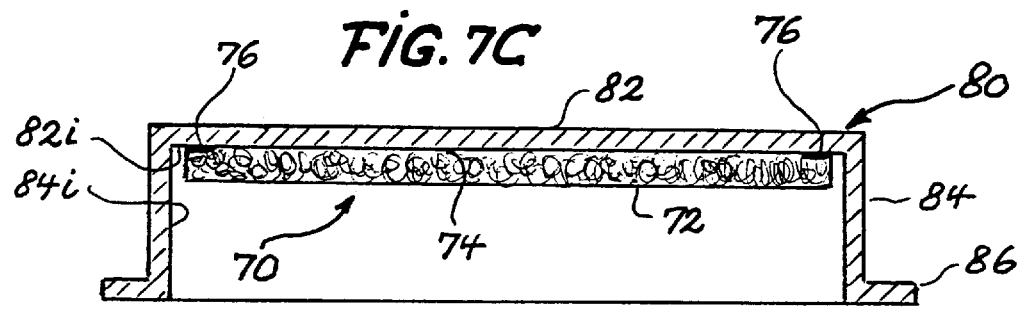
FIG. 7C is a sectional view of a housing which has a compliant electrically conductive member attached to an interior upper surface.

It will be appreciated that the compliant electrically conductive member 70 can be preformed along the upper inside surface 82i of the housing 80 (see FIG. 7C).

FIGS. 6A–6F are illustrative top views of open-ended casings which can be readily constructed by simple metal bending procedures.

Figure 6A:
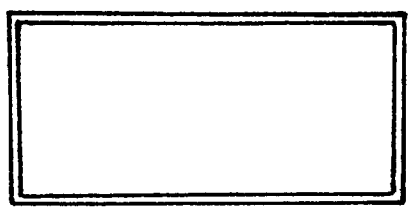
FIGS. 6A–6F are top views of examples of polygonal open-ended casings, and of a cylindrical open-ended casing.
Figure 6B:
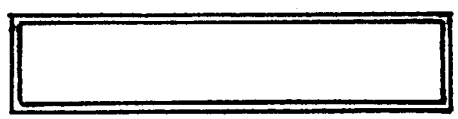
Figure 6C:
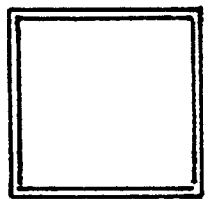
Figure 6D:
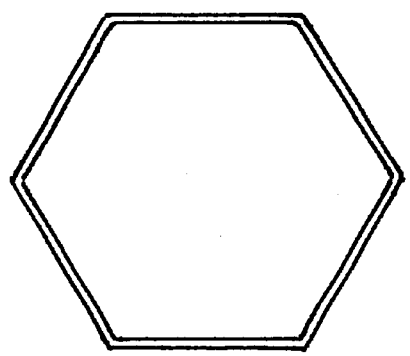
Figure 6E:
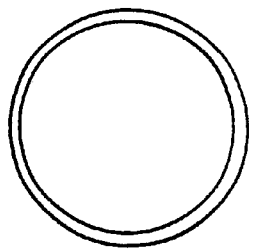

FIGS. 6A and 6B show top views of rectangular casings;

FIG. 6C depicts a square open-ended casing;

FIG. 6D shows a top view of a hexagonal open-ended casing;

FIG. 6E is a top view of a cylindrical open-ended casing; and

Figure 6F:
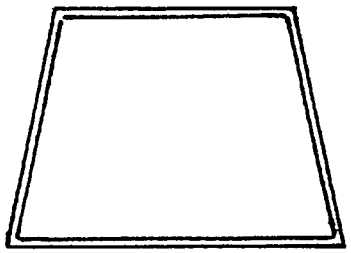

FIG. 6F is a top view of a trapezoidal casing.

Particular shapes and sizes of casings will be governed by sizes, shapes, and arrangements of electronic components or sub-assemblies on the printed wiring board 10.

FIG. 7A is a sectional view of a printed wiring board assembly having electronic components 54 and 56 surrounded by a casing 40, and showing a casing 20 fixedly attached on the wiring board assembly 10 in a designated location.

FIG. 7B is a sectional view of the printed wiring board assembly 10 spaced from an electrically conductive base plate 60. An electronic component 52 has now been inserted into the casing 20 through the open upper end 20u. As indicated previously, the open upper ends of the casings readily permit installation or insertion of electronic components or subassemblies after the lower ends of the casings having been fixedly attached to the printed wiring board 10, for example, by soldering.

FIG. 7C is a sectional view of a housing 80 which has a compliant electrically conductive member 70 attached to an interior upper surface 82i of the housing. A peripheral adhesive bond 76 can be used to bond an upper surface 74 of the compliant member 70 against the electrically conductive surface 82i of the housing.

Figure 7D:
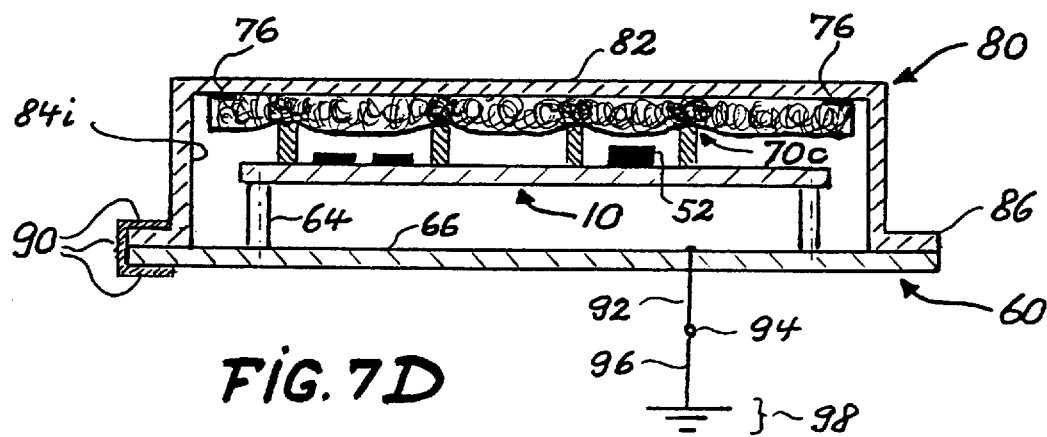
FIG. 7D is a sectional view of a completed wiring board assembly in which the compliant electrically conductive member is attached to an interior upper surface of a housing, with the compliant member compressed in regions above the upper ends of the casings.

FIG. 7D is a sectional view of a completed wiring board assembly in which the compliant electrically conductive member 70 remains attached to the interior upper surface of the housing 80 by the peripheral adhesive bond 76. Compression of the compliant member is indicated at 70c in regions overlying the upper ends of the casings when the housing 80 is drawn against the base plate 60.

From the foregoing description, it will be apparent that EMI/RFI shields of relatively simple construction have been provided for protection of selected electronic components and electronic sub-assemblies which are mounted on a printed wiring board assembly. Shielded electronic components are readily accessible for servicing. Variations and modifications in the herein described plurality of shields within the scope of the present invention will undoubtedly suggest themselves to those skilled in this art. Accordingly, the foregoing description should be taken as illustrative and not in a limiting sense.

What is claimed is:

1. A plurality of shields for shielding each one of a plurality of selected electronic components and of selected electronic sub-assemblies disposed on a printed wiring board assembly from electromagnetic interference (EMI) and/or from radio frequency interference (RFI), the shields comprising:

open-ended electrically conductive casings having sidewalls extending between lower ends and upper ends of the casings;

the lower ends of the casings fixedly attached on the printed wiring board assembly so as to surround the selected electronic components and the selected electronic sub-assemblies;

a compliant electrically conductive member having a lower surface and an upper surface, the lower surface disposed in common over the upper ends of the casings;

an electrically conductive housing having disposed over the upper surface of the compliant member, a surface of the housing providing compression of the compliant member such that electrical contact is maintained between the housing and the upper ends of the casings; and an electrically conductive base plate spaced from the wiring board assembly and connected to an electrical ground potential, the housing removably attached to the base plate to provide the plurality of shields when the housing is attached to the base plate, and alternatively to provide access to the selected electronic components and to the electronic sub-assemblies through the upper ends of the casings when the housing is removed from the base plate and the compliant member is removed from the upper ends of the casings.

2. The plurality of shields of claim 1 wherein the compliant electrically conductive member includes an electrically conductive foam.

3. The plurality of shields of claim 1 wherein the compliant electrically conductive member includes an electrically conductive elastomer.

4. The plurality of shields of claim 1 wherein the compliant electrically conductive member includes a compliant layer having electrically conductive surfaces.

5. The plurality of shields of claim 1 wherein the electrically conductive housing includes at least an electrically conductive interior surface disposed over the upper surface of the compliant electrically conductive member and being in electrical contact with the electrically conductive base plate.

6. The plurality of shields of claim 1 wherein the electrically conductive housing includes at least an electrically conductive interior surface connected to an electrical ground potential and the electrically conductive housing being in electrical contact with the electrically conductive surface of the base plate.

7. The plurality of shields of claim 1 wherein the open-ended electrically conductive casings have polygonal sidewalls.

8. The plurality of shields of claim 7 wherein the polygonal sidewalls are rectangular sidewalls.

9. The plurality of shields of claim 1 wherein the open-ended electrically conductive casings include casings having polygonal sidewalls and casings having cylindrical sidewalls.

* * * * *